United States Patent [19]

Sugawara

[11] 4,123,723
[45] Oct. 31, 1978

[54] TRANSISTOR AMPLIFIER CIRCUIT

[75] Inventor: Tsutomu Sugawara, Yokohama, Japan

[73] Assignee: Tokyo Shibaura Electric Co., Ltd., Kawasaki, Japan

[21] Appl. No.: 813,467

[22] Filed: Jul. 7, 1977

[30] Foreign Application Priority Data

Jul. 9, 1976 [JP] Japan .................. 51-81741

[51] Int. Cl.² .............................................. H03F 3/04
[52] U.S. Cl. ................................ 330/311; 307/313; 330/263; 330/296
[58] Field of Search ............... 307/313, 315; 330/263, 330/296, 311

[56] References Cited

FOREIGN PATENT DOCUMENTS 424,312  9/1971  U.S.S.R. ............................. 307/313 X

OTHER PUBLICATIONS

"10 AMP/80 Volt Power Darlington"—Tentative Engineering Data Sheet — Bendix Corp., 11/68.

Primary Examiner—Lawrence J. Dahl
Attorney, Agent, or Firm—Oblon, Fisher, Spivak, McClelland & Maier

[57] ABSTRACT

An amplifier circuit is provided with a first transistor receiving at the base an input signal and a second transistor related to its first transistor in complementary fashion. A first load resistor is provided between the base and the collector of the second transistor. A second load resistor is provided between the junction of the collector of the first transistor and the emitter of the second transistor and a power source. An output signal is taken out from the junction.

5 Claims, 6 Drawing Figures

TRANSISTOR AMPLIFIER CIRCUIT

BACKGROUND OF THE INVENTION

This invention relates to a transistor amplifier circuit using complementary type transistors.

By convention, when a high impedance signal source is connected to a load circuit, an impedance converter is provided between the signal source and the load circuit, with an intention of reducing the impedance. Such impedance converter is required to satisfy a severe condition that the input impedance must be high and the distortion factor must be low over the wide range from low frequency to high frequency of the input signal. One of the widely used impedance converters is an transistor amplifier.

FIG. 1 shows an example of the conventional transistor amplifier circuits. In the figure, reference numerals 2, 4 and 6 designate an input signal source, an NPN transistor for amplification, and a load resistor, respectively. +Vcc and −Vcc denote a positive power source and a negative power source, respectively. Further, IN and OUT are an input and an output terminals, respectively. Ccb is a capacitance between the collector and base of the transistor 4. With designation that $\beta$ is used for representing the current amplification factor of the transistor 4 and R for the resistance of the load resistor 6, the input impedance is given by the product of the current amplification factor $\beta$ and the resistance R, i.e. $\beta \cdot R$, in the low frequency region of the input signal. From this fact, it will be seen that increase of the input impedance is easily attained by using a transistor having a high current amplification factor $\beta$ and a load resistor having a high resistance R. In the high frequency region, however, the capacitance Ccb between the collector and base of the transistor 4 reduces the impedance therebetween. Therefore, in this case, it is difficult to keep the input impedance high.

For avoiding such problem, an amplifier circuit as shown in FIG. 2 was proposed. As shown, an amplifier 16 with voltage gain of about 1 is additionally inserted between the emitter and the collector of the transistor 12. With such a construction, the collector potential of the transistor is substantially equal to the emitter potential. In other words, the collector potential changes following the change of the input signal applied to the base. For this, the voltage between the collector and the base is kept substantially constant. Accordingly, the influence of the capacitance Ccb is reduced, this enabling the input impedance to be kept high even in the high frequency region. In FIG. 2, the load resistor is designated by reference numeral 14.

Let consider now the total harmonic distortion factor of this amplifier circuit. Even if the amplifier is used which satisfies the bias condition placing the transistor 12 in the active region and has a small distortion factor, since the characteristic of the base-emitter voltage versus emitter current of the transistor 12 is inherently nonlinear, it is difficult to reduce the distortion factor of the entire transistor amplifier circuit. In other words, the low distortion of only the amplifier 16 fails to improve the distortion factor of the entire transistor amplifier circuit.

FIG. 3 shows the variations of the total harmonic distortion factor when the frequency of the input signal is changed. The respective curves plotted in the graph result from the experiment conducted under the condition that the signal source 2 has the impedance of 48 (K$\Omega$), the input signal is 3V, and the voltages of +Vcc and −Vcc power source are 10V. The distortion factor in the circuit of FIG. 2 is denoted by the character A. The distortion factor A is substantially constant independently of the frequency change, although its magnitude is high. This graph indicates that not only the distortion factor of the amplifier 16 but also the nonlinearity characteristic of the base emitter voltage versus emitter current of the transistor 12 must be taken into consideration in order to improve the distortion factor of the entire transistor amplifier circuit. The second order distortion occupies most of the distortion due to the non-linearity inherent to the transistor. To cope with this problem a transistor amplifier circuit was proposed as shown in FIG. 4. As shown, in this amplifier circuit, complementary transistors 22 and 24 are connected in cascade fashion so that the second order distortions of the respective transistors can cancel to each other, resulting in reduction of the distortion factor. However, as in the FIG. 1 case, in the high frequency region, the influence of the non-linear capacitor Ccb between the collector and the base is actualized to reduce the input impedance and therefore to result in increase of the distortion factor. In the figure, reference numerals 26 and 28 designate first and second load resistors, respectively. The curve B in FIG. 3 shows the characteristic of the distortion factor versus to frequency in this circuit. As seen from the curve B, the distortion factor of the FIG. 4 circuit exhibits a low value in the low frequency range but a high value in the high frequency range.

SUMMARY OF THE INVENTION

Accordingly, the primary object of the invention is to provide a transistor amplifier circuit which maintains its high input impedance with a low distortion factor over a wide frequency range from low to high frequency.

According to the present invention, there is provided a transistor amplifier circuit comprising; a first and a second power sources of which the polarities are opposite to each other; an input terminal; a first output terminal; a first transistor which is connected at the base to the input terminal and at the collector to the first output terminal; a second transistor related to the first transistor in complementary fashion, which the second transistor is connected at the base to the emitter of the first transistor and at the collector to the first power source and at the emitter to the first output terminal; first resistive means which is connected at one end to the emitter of the first transistor and at the other end to the first power source; second resistive means having much smaller resistance than that of the first resistive means, which the second resistive means is connected at one end to the connection point of the collector of the first transistor, the emitter of the second transistor and the first output terminal, and connected at the other end to the second power source.

Other objects and features of the invention will be apparent from the following description in connection with the accompanying drawings, in which:

DETAILED DESCRIPTION OF THE PREFERRED EMBODIMENTS

Figure 5:
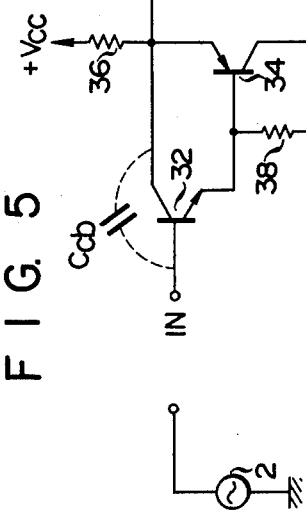
FIG. 5 shows a schematic diagram of an embodiment of a transistor amplifier circuit of the invention.
Figure 1:
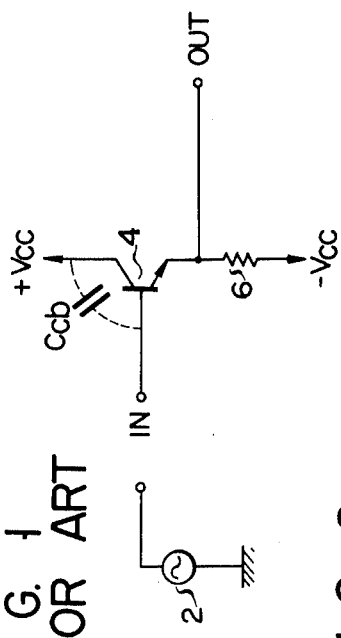
FIG. 1 shows a schematic diagram of one form of the conventional transistor amplifier circuits.
Figure 2:
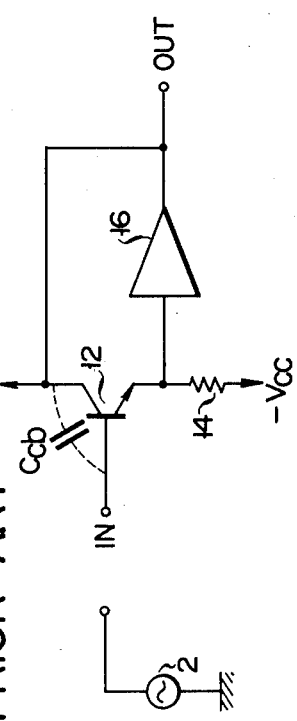
FIG. 2 shows a schematic diagram of another conventional transistor amplifier circuit.
Figure 4:
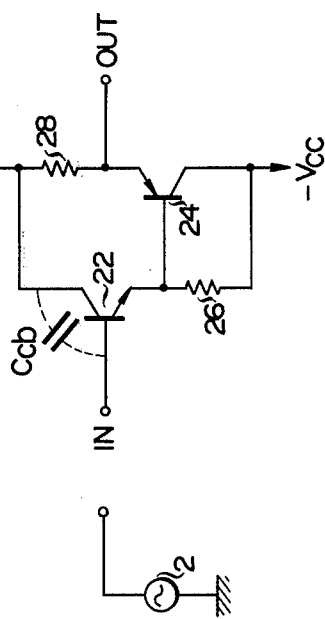
FIG. 4 shows a schematic diagram of still another example of the conventional transistor amplifier circuit.

Reference is now made to FIG. 5 illustrating an embodiment of a transistor amplifier circuit of the invention. As shown, a transistor 32 of, for example, NPN type is connected at the base to an input terminal IN connected to an input signal source 2, for example, grounded at one end. The transistor 32 is connected at the collector to an output terminal OUT and at the emitter to the base of a PNP transistor 34 which is complementary to the transistor 32. The transistor 34 is connected at the emitter to the collector of the transistor 32 and to a positive power source +Vcc via a load resistor 36. The collector of the transistor 34 is connected to a negative power source −Vcc. Another load resistor 38 is connected between the base collector of the transistor 34. Necessarily, the resistance $R_1$ of the load resistor 36 is much smaller than that $R_2$ of the resistor 38. As shown and described, the emitter of the transistor 34 is connected to the collector of the transistor 32. However, the collector current of the transistor 32 is smaller than that of the transistor 34. Because the load resistors 36 and 38 are related by $R_1 << R_2$. This indicates that there is not such a case that the collector current of the transistor 32 becomes dominant while the emitter current of the transistor becomes extremely small. Since the collector-emitter voltage of the transistor 32 is equal to the base-emitter voltage of the transistor 34, the transistor 32 is sustained in the active region.

As described above, the collector-emitter voltage of the transistor 32 is equal to the base-emitter voltage of the transistor 34. Therefore, even if the voltage of the input signal changes, it is kept substantially constant (normally approx. 0.6 volt). For this, the collector-base voltage of the transistor 32 is kept at about 0V, with the result that, in the high frequency region of the input signal, the reduction of the input impedance due to the effect of the non-linear capacitance Ccb between the collector and base of the transistor 32 is negligible. Thus, if a transistor with a sufficiently large current amplification factor $\beta$ is used for the transistor 32, and a resistor with a sufficiently large resistance $R_1$ is used for the load resistor 38, a high input impedance may be ensured over a wide range of the input signal from low to high frequency regions.

When the voltage of the input signal changes, the voltage between the base and the emitter of the transistor 32 changes slightly; however, this voltage change is opposite in polarity to that of the transistor 34, since these transistors are complementary type. The second order distortions which are the major component of the distortions due to the non-linearity characteristics of the respective transistors, cancel to each other. This reduces the distortion factor of the amplifier circuit. As described above, the amplifier circuit of this example sustains its high input impedance in the high frequency region. Therefore, a low distortion factor may be maintained in the high frequency region even if the input signal source connected thereto, has a high input impedance.

Figure 3:
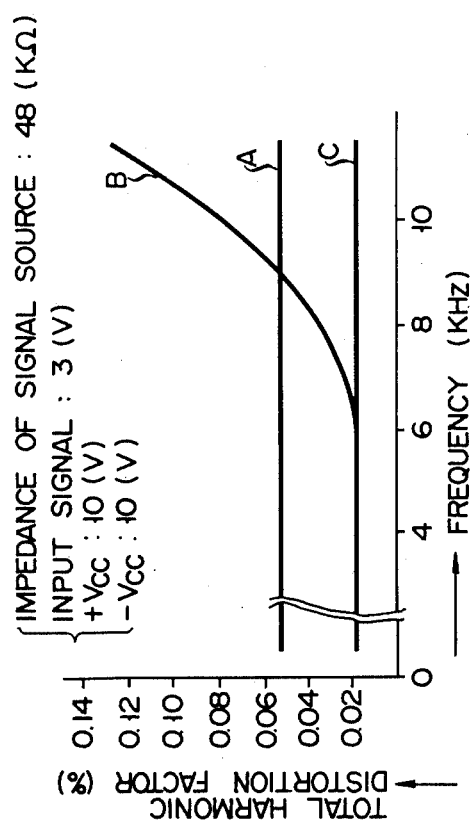
FIG. 3 shows a graph illustrating the relation of the distortion factor to the frequency of an input signal.
Figure 6:
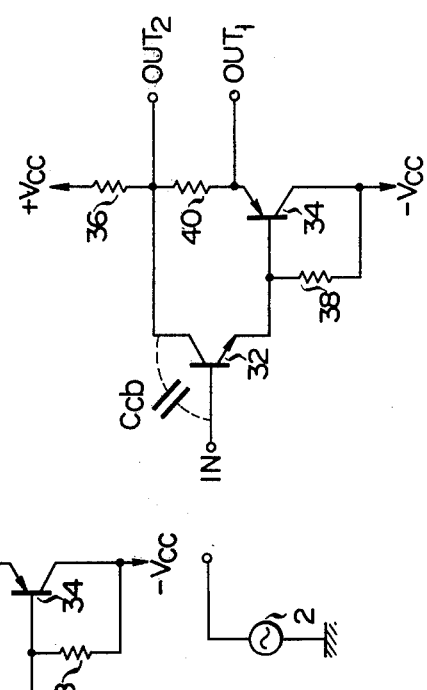
FIG. 6 shows a schematic diagram of another embodiment of the transistor amplifier circuit of the invention.

FIG. 6 shows another embodiment of the transistor amplifier circuit of the invention. In this example, an additional resistor 40 is inserted between the emitter of the transistor 34 and the connection point of the output terminal $OUT_2$, the negative power source +Vcc and the collector of the transistor 32. The resistance value $R_3$ of the resistor 40 is selected to be much smaller than that $R_1$ of the resistor 36. With such the selection, the effect may be attained which are similar to that obtained by the FIG. 5 embodiment. In this example, the collector-emitter voltage of the transistor 32 is set larger than the emitter-base voltage, with the result that the non-linear collector-base capacitance Ccb of the transistor 32 is made small. Consequently, the input impedance is less influenced by the capacitance Ccb in the high frequency region of the input signal. The output signal may be taken out either from the emitter of the transistor 34, i.e. the output terminal $OUT_1$, or the junction of the first resistor 36 and the third resistor 40, i.e. the output terminal $OUT_2$.

In the embodiments, the types of the transistors may be replaced by their complementary types; for example, the NPN transistor may be replaced by the PNP transistor. Obviously, in this case, the polarity of the power source should be reversed.

What is claimed is:

1. A transistor amplifier circuit comprising:
   a first and a second power sources of which the polarities are opposite to each other;
   an input terminal;
   a first output terminal;
   a first transistor which is connected at the base to said input terminal and at the collector to said first output terminal;
   a second transistor related to said first transistor in complementary fashion, which said second transistor is connected at the base to the emitter of said first transistor and at the collector to said first power source and at the emitter to said first output terminal;
   first resistive means which is connected at one end to the emitter of said first transistor and at the other end to said first power source;
   second resistive means having much smaller resistance than that of said first resistive means, which said second resistive means is connected at one end to the connection point of the collector of said first transistor, the emitter of said second transistor and said first output terminal, and connected at the other end to the second power source.

2. A transistor amplifier circuit according to claim 1, wherein said first transistor is of NPN type and said second transistor is of PNP type.

3. A transistor amplifier circuit according to claim 1, wherein said first transistor is of PNP type and said second transistor is of NPN type.

4. A transistor amplifier circuit according to claim 1, further comprising a third resistive means connected between the emitter of said second transistor and the connection point of the collector of said first transistor, and said first resistive means, said third resistive means having a much smaller resistance than that of said second resistive means.

5. A transistor amplifier circuit according to claim 4, further comprising a second output terminal connected to the emitter of said second transistor.

* * * * *